United States Patent [19]
Sakai et al.

[11] Patent Number: 5,652,069
[45] Date of Patent: Jul. 29, 1997

[54] BATTERY POWER MONITORING APPARATUS FOR VEHICLE

[75] Inventors: Shoji Sakai; Mitsuo Inagaki; Sadahisa Onimaru; Hironori Asa, all of Nishio, Japan

[73] Assignee: Nippon Soken Inc., Japan

[21] Appl. No.: 566,662

[22] Filed: Dec. 4, 1995

[30] Foreign Application Priority Data

Dec. 2, 1994 [JP] Japan .................. 6-329454

[51] Int. Cl.$^6$ .................................................. H01M 10/48
[52] U.S. Cl. .......................... 429/92; 429/90; 320/48
[58] Field of Search ............................ 429/90, 91, 92, 429/93; 320/48

[56] References Cited

U.S. PATENT DOCUMENTS 5,479,085  12/1995  Honda et al. ..................... 320/48
5,518,835   5/1996  Simmonds ......................... 429/90

FOREIGN PATENT DOCUMENTS 1-193675   8/1989   Japan .

*Primary Examiner*—M. Nuzzolillo
*Attorney, Agent, or Firm*—Cushman Darby & Cushman IP Group of Pillsbury Madison & Sutro LLP

[57] ABSTRACT

A battery power monitoring apparatus for use in an electric automobile is provided. The battery power monitoring apparatus determines the amount of available reserve electric power remaining in a storage battery based on electric power discharged from the storage battery to an electric motor and a battery characteristic stored in a memory, representing a relation between a voltage level at which a given level of current flows from the storage battery and the then discharged electric power. The battery characteristic is updated based on the latest detected voltage of the storage battery and current flowing from the storage battery. The battery power monitoring apparatus determines that charge polarization has occurred when a voltage level of the storage battery from which the given level of current flows is increased, and prohibits the updating of the battery characteristic. With this operation, the amount of available electric power is calculated correctly even under the influence of charge polarization.

8 Claims, 6 Drawing Sheets

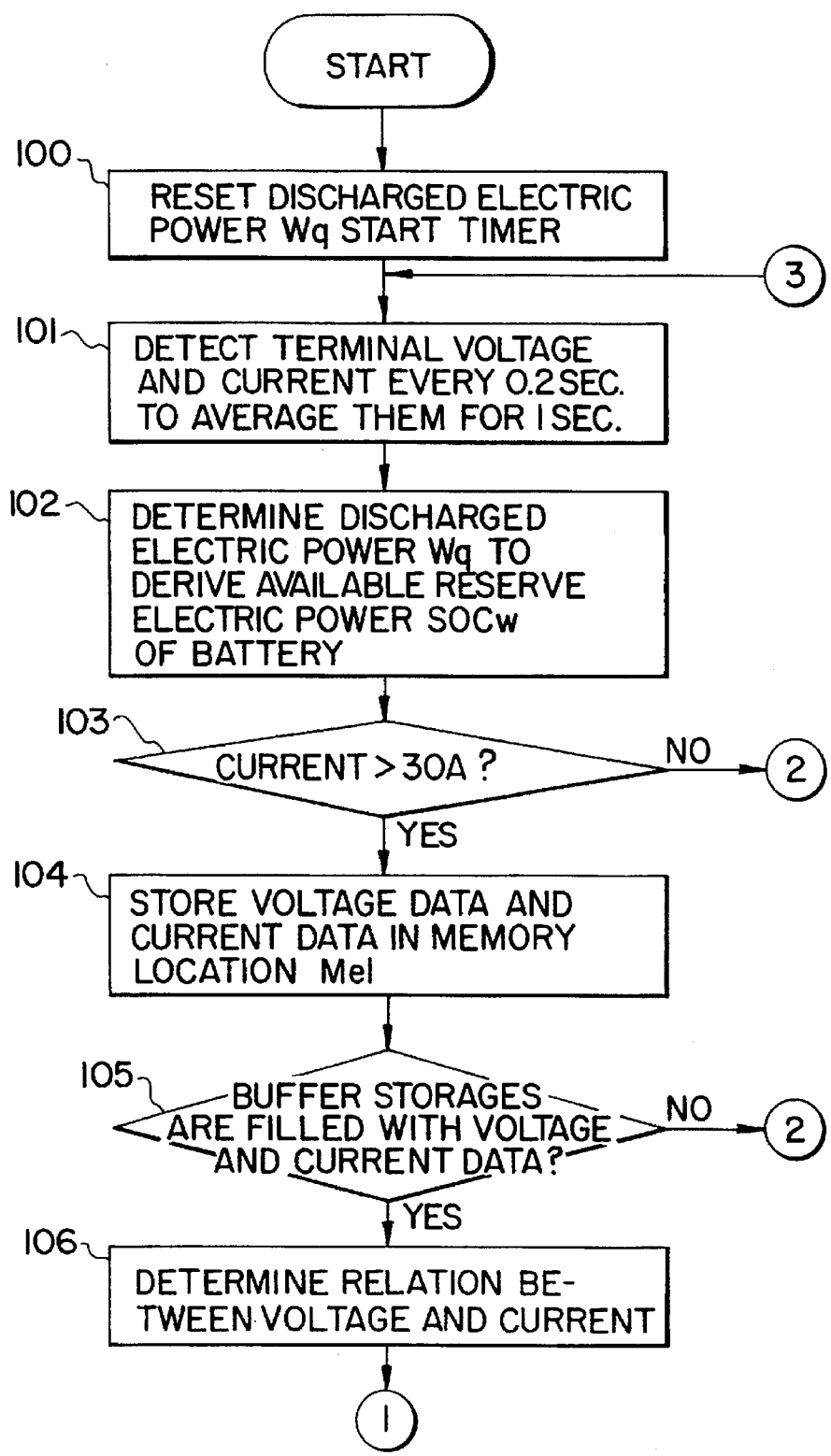

BATTERY POWER MONITORING APPARATUS FOR VEHICLE

BACKGROUND OF THE INVENTION

1. Technical Field

The present invention relates generally to a battery condition determining apparatus which may be employed in an electric automobile. More particularly, the invention relates to a battery power monitoring apparatus for monitoring available reserve electric power of a storage battery correctly even under the influence of charge polarization.

2. Background Art

Japanese Patent First Publication No. 1-193675 teaches a battery residual life monitoring system which detects an internal resistance of a battery during use to determine a discharge time, and calculates a useful reserve life of the battery by using mapped data representing the relation between a battery internal resistance and a discharge time.

Usually, a storage battery mounted in an electric automobile is discharged and recharged many times during traveling. Particularly, the storage battery is recharged frequently by regenerative braking and in recharge stations, causing so-called charge polarization to occur. It is, therefore, difficult to determine an available reserve capacity of the storage battery based only on its internal resistance, requiring the monitoring of the charge polarization for correctly determining an available reserve capacity remaining in the battery.

SUMMARY OF THE INVENTION

It is therefore a principal object of the present invention to avoid the disadvantages of the prior art.

It is another object of the present invention to provide a battery power monitoring apparatus which is designed to monitor the charge polarization of a storage battery after it is recharged to determine an available electric power reserve remaining in the storage battery.

According to one aspect of the present invention, a battery condition determining apparatus is provided which comprises: a detecting means for detecting a voltage of a storage battery and a current flowing from the storage battery to a given electric load; a battery characteristic storing means for storing a given predetermined battery characteristic of the storage battery based on at least a relation between a voltage of the storage battery and a current flowing from the storage battery to the given electric load; a first battery condition parameter determining means for determining a first battery condition parameter representing a given battery condition based on a relation between the voltage and the current detected by the detecting means; a second battery condition parameter determining means for determining a second battery condition parameter representing the given battery condition based on the battery characteristic stored in the battery characteristic storing means using the voltage and the current detected by the detecting means; and a charge polarization determining means for determining occurrence of charge polarization in the storage battery, the charge polarization determining means determining that the charge polarization has occurred when the second battery condition parameter is different from the first battery condition parameter.

In the preferred mode of the invention, the battery characteristic represents a predetermined relation between a voltage level of the storage battery at which a given level of current flows from the storage battery and the amount of discharged electric power discharged from the storage battery. The first battery condition parameter represents a voltage level of the storage battery relative to the given level of current projected using a relation between the voltage and the current detected by the detecting means. The second battery condition parameter represents a voltage level in the battery characteristic stored in the battery characteristic storing means, corresponding to the amount of discharged electric power derived based on the voltage and the current detected by the detecting means.

A battery power determining means is provided for determining the amount of available reserve electric power remaining in the storage battery based on discharged electric power discharged from the storage battery, determined by the voltage and the current detected by the detecting means and the battery characteristic stored in the battery characteristic storing means. The detecting means samples the voltage and the current of the storage battery at given sampling cycles. The battery power determining means updates the battery characteristic stored in the battery characteristic storing means based on the latest sampled terminal voltage and current, and is prohibited from updating the battery characteristic when the charge polarization determining means determines that charge polarization has occurred.

The charge polarization determining means determines that the charge polarization has occurred when the second battery condition parameter is greater than the first battery condition parameter.

The battery power determining means determines the amount of available reserve electric power SOCw based on the following relation:

$$SOC_w = (W_{now} - Wq)/Wb \bullet 100(\%)$$

where $W_{now}$ represents the amount of useful electric power of the storage battery over a range from a fully charged voltage level and a fully discharged voltage level, defined by the battery characteristic stored in the battery characteristic storing means, Wq represents the discharged electric power, and Wb is an initial value of $W_{now}$.

According to another aspect of the present invention, there is provided a battery condition determining apparatus which comprises: a detecting means for detecting a voltage of a storage battery and a current flowing from the storage battery to a given electric load; a battery characteristic storing means for storing a battery characteristic defined by a parameter representing a given battery condition including a relation between a voltage of the storage battery and a current flowing from the storage battery; a battery power determining means for determining the amount of available reserve electric power of the storage battery based on electric power discharged from the storage battery determined from the voltage and the current detected by the detecting means and the amount of useful electric power of the storage battery over a range from a fully charged voltage level and a fully discharged voltage level, derived from the parameter in the battery characteristic stored in the battery characteristic storing means; a first battery condition parameter determining means for determining a first battery condition parameter based on the voltage and the current detected by the detecting means; a second battery condition parameter determining means for determining a second battery condition parameter based on the battery characteristic stored in the battery characteristic storing means; and a charge polarization determining means for determining the occurrence of charge polarization in the storage battery, the charge polarization determining means determining that charge polarization has occurred when the second battery condition parameter is different from the first battery condition parameter.

In the preferred mode of the invention, the battery characteristic represents a predetermined relation between a voltage level of the storage battery at which a given level of current flows from the storage battery and the amount of discharged electric power discharged from the storage battery. The first battery condition parameter represents a voltage level of the storage battery relative to the given level of current projected using a relation between the voltage and the current detected by the detecting means. The second battery condition parameter represents a voltage level in the battery characteristic stored in the battery characteristic storing means, corresponding to the amount of discharged electric power derived based on the voltage and the current detected by the detecting means.

The detecting means samples the voltage and the current of the storage battery at given sampling cycles. The battery power determining means updates the battery characteristic stored in the battery characteristic storing means based on the latest sampled terminal voltage and current, and is prohibited from updating the battery characteristic when the charge polarization determining means determines that charge polarization has occurred.

BRIEF DESCRIPTION OF THE DRAWINGS

The present invention will be understood more fully from the detailed description given below and from the accompanying drawings of the preferred embodiment of the invention, which, however, should not be taken to limit the invention to the specific embodiment but are for explanation and understanding only.

In the drawings:

FIGS. 3 and 4 show a flowchart of a program performed by a control unit of a battery power monitoring apparatus to determine an available reserve electric power remaining in a storage battery;

DESCRIPTION OF THE PREFERRED EMBODIMENT

Figure 1:
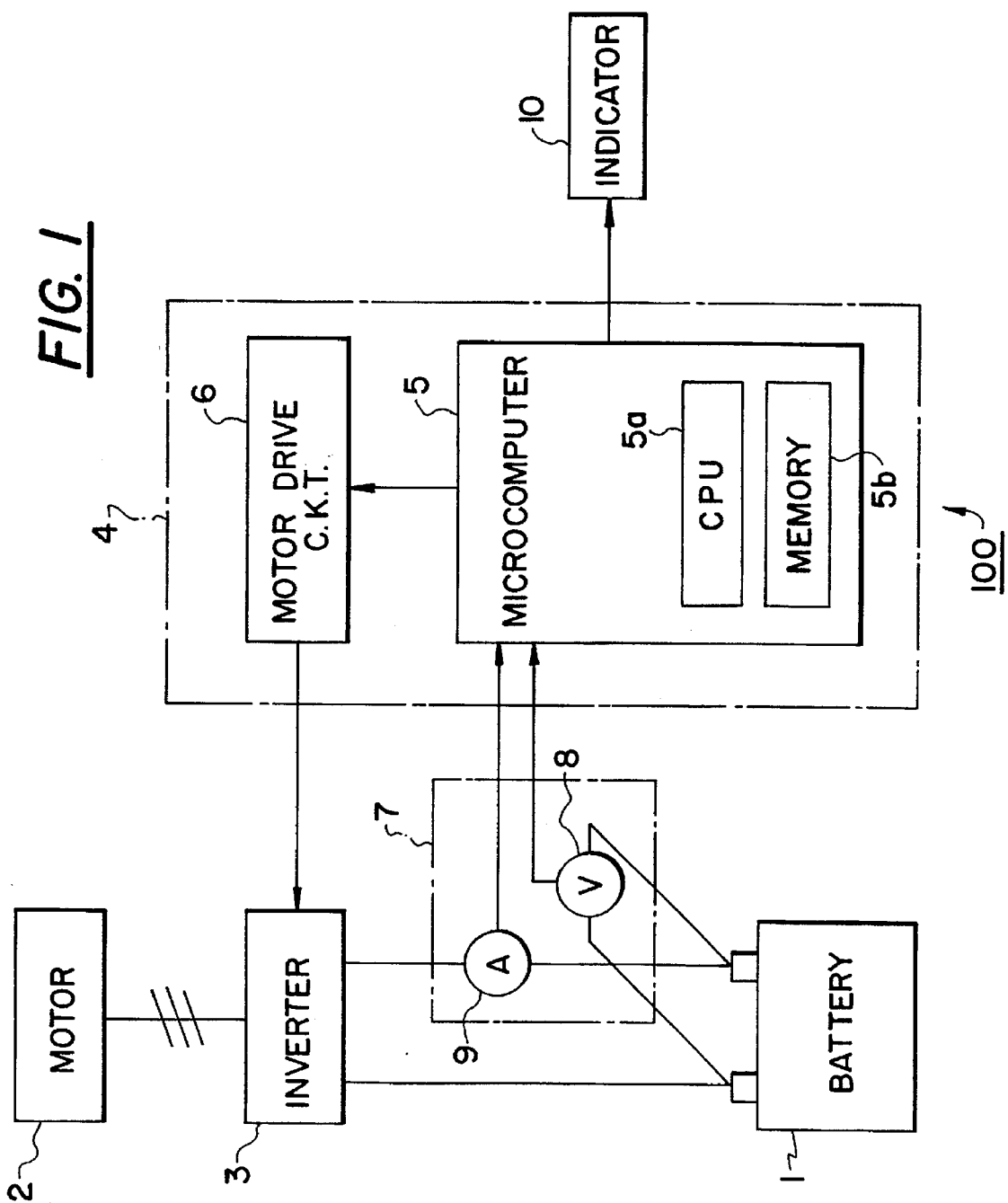
FIG. 1 is a block diagram which shows a battery power monitoring apparatus according to the present invention.

Referring now to the drawings, particularly to FIG. 1, there is shown a battery power monitoring apparatus 100 according to the present invention which is employed in electric automobiles. Of course, the battery power monitoring apparatus may be used with any other machines having batteries as power sources.

The battery power monitoring apparatus 100 generally includes an electronic control unit (ECU) 4, a detecting unit 7, and a battery power indicator 10.

A battery unit 1 is connected at both terminals through an inverter 3 to an electric driving motor 2 installed on the electric automobile. The battery unit 1 includes, for example, sixteen lead acid storage batteries which are arranged in series to have a five-hour rate capacity of 150 Ah.

The ECU 4 includes a microcomputer 5 and a motor drive circuit 6. The microcomputer 5 consists of a CPU 5a and a memory 5b. The detecting unit 7 includes a voltage detector 8 and a current detector (ammeter) 9. The voltage detector 8 measures the terminal voltage appearing between the positive and negative terminals of the battery unit 1, and provides a signal indicative thereof to the microcomputer 5. The current detector 9 measures a discharge current from the battery unit 1 to the motor 2, a recharging current from the motor 2 to the battery unit 1, or a recharging current from a high-speed charger (not shown) to the battery unit 1, and provides a signal indicative thereof to the microcomputer 5.

The memory 5a of the microcomputer 5, as will be discussed later in detail, stores therein a battery characteristic. The CPU 5a detects a battery condition and the amount of available reserve electric power remaining in the battery unit 1, and monitors charge polarization of the battery unit 1. Specifically, the CPU 5a is responsive to signals from the detecting unit 7 to provide a battery condition parameter indicating the internal resistance of the battery unit 1 or a terminal voltage when a given current flows to or from the battery unit 1, and the amount of electric power discharged from the battery unit 1 which is charged fully. In addition, the CPU 5a also uses the battery characteristic stored in the memory 5b to calculate the amount of available reserve electric power remaining in the battery unit 1 based on the detected battery condition, and displays it on the battery power indicator 10. Further, the CPU 5a determines the influence of the charge polarization on the battery unit 1, when recharged rapidly, based on the detected battery condition and the battery characteristic stored in the memory 5b.

Figure 2:
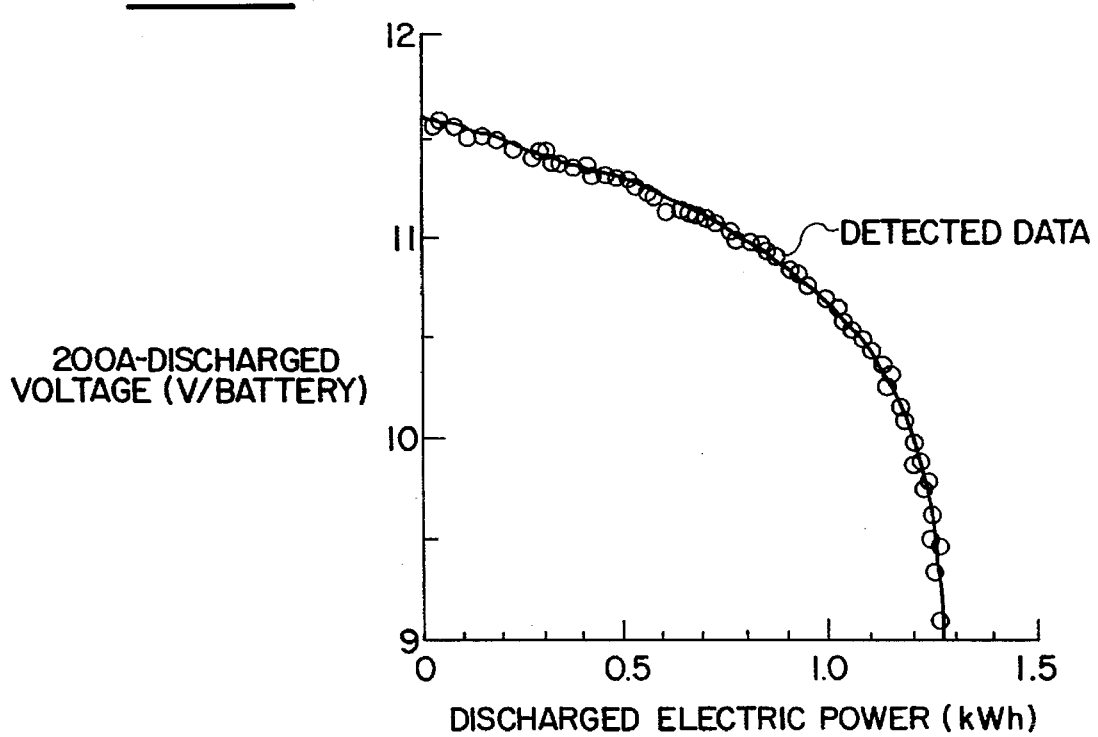
FIG. 2 is a graph which shows a battery characteristic stored in a memory which is defined by the relation between a 200 A-discharged voltage level and the amount of discharged electric power.

The memory 5b, stores as the battery characteristic, the relation between the terminal voltage of one battery when a given current (e.g., 200 A) flows therefrom and the amount of discharged electric power, as shown in FIG. 2. A symbol "o" represents experimental data indicating a battery terminal voltage and the amount of discharged electric power calculated by the CPU 5a based on values detected by the detecting unit 7 when the battery was discharged experimentally at 200 A from a fully charged level to a fully discharged level. The CPU 5a determines a parameter indicative of the amount of available reserve electric power or capacity remaining in the battery unit 1 corresponding to a power consumption based on the amount of electric power discharged during use of the battery unit 1 and a 200 A-discharged battery voltage.

The memory 5b may alternatively store a discharged electric power-200 A-discharged battery voltage relation that is expressed in polynomial or exponential function.

Figure 4:
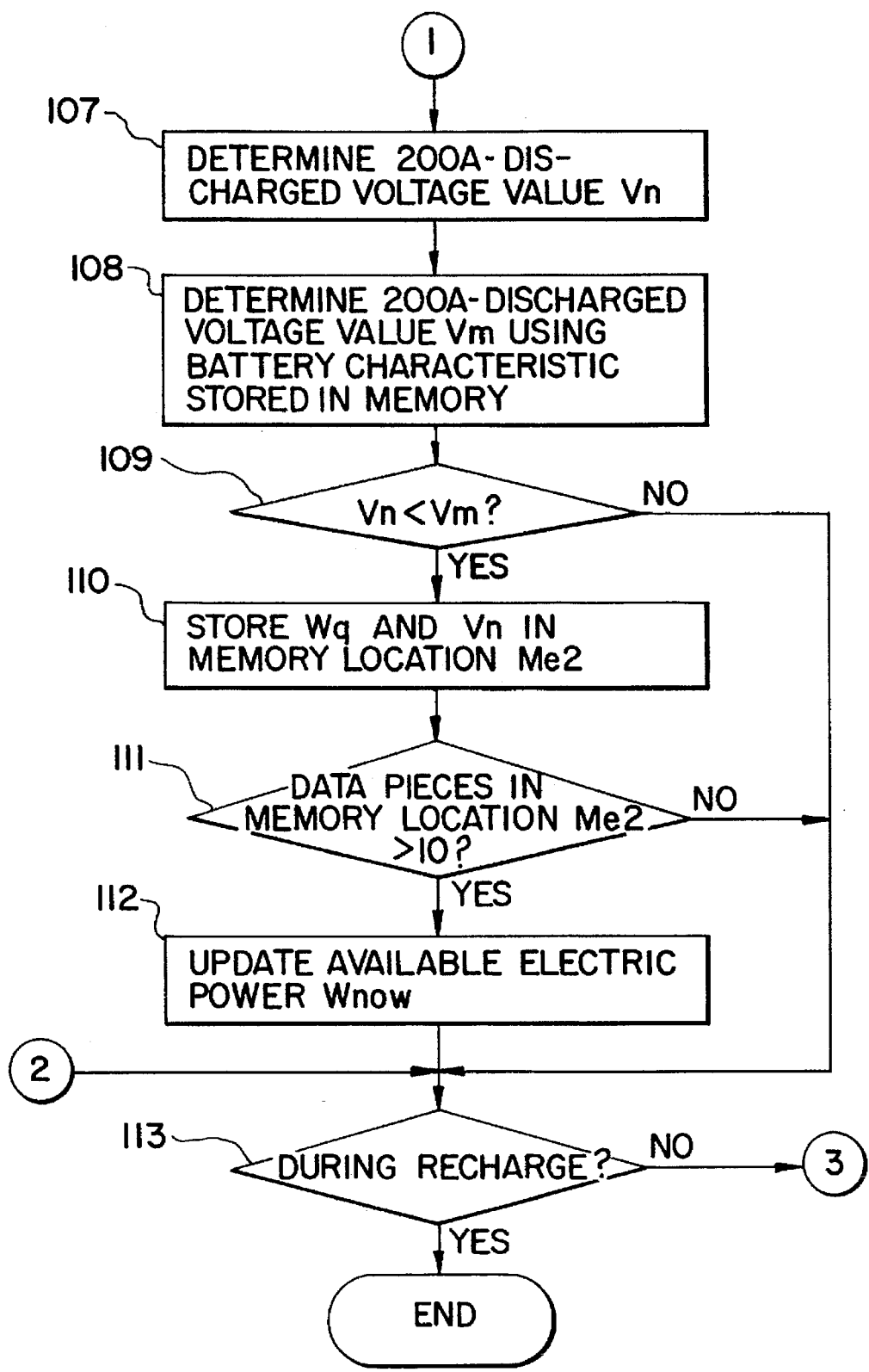

FIGS. 3 and 4 show a flowchart of a program or sequence of logical steps performed by the CPU 5a. This program is carried out after the battery unit 1 is charged fully.

After entering the program, the routine proceeds to step 100 wherein an initializing process is performed to reset a power parameter indicating the amount of discharged electric power Wq to zero, and activates a timer provided in the CPU 5a. The routine then proceeds to step 101 wherein the terminal voltage and the current of the battery unit 1 detected by the detecting unit 7 are sampled at every cycle of 0.2 sec. according to a count value of the timer in order to average these sampled values over a 1 sec. period, respectively. The routine then proceeds to step 102 wherein the discharged electric power Wq is determined based on the average values of terminal voltages and currents derived in step 101 to determine a residual electric energy $SOC_w$ of the battery unit 1 according to the relation below, $SOC_w$ is then displayed on the battery power indicator 10.

$$SOC_W = (W_{now} - Wq)/Wb \bullet 100(\%) \qquad (1)$$

where $W_{now}$ is a parameter changed according to a variation in load of the motor 2 and deterioration of the battery unit 1, representing a total amount of available electric power which will be consumed over a range from a fully charged voltage level to a fully discharged voltage level (i.e., a discharge disable voltage level) under a current traveling condition of the electric automobile, and Wb is an initial value of $W_{now}$ before use of the battery unit 1. The available electric power $W_{now}$ is updated in step 112, as will be discussed in detail later.

The routine then proceeds to step 103 wherein it is determined whether the current detected by the detecting unit 7 is greater than 30 A or not. If a NO answer is obtained, then the routine proceeds to step 113 shown in FIG. 4. Alternatively, if a YES answer is obtained, then the routine proceeds to step 104 wherein the average values of the voltages and currents determined in step 101 are stored in a memory location Me1 consisting of two sets of sixty buffer storages each for one of the voltage data and the current data. When the buffer storages become full, the contents thereof are updated, so that the latest voltage and current data are stored in the memory location Me1. The routine then proceeds to step 105 wherein it is determined whether the buffer storages are filled with the voltage and current data or not, and whether there is a deviation in the current values or not for determining whether the sampled current values are concentrated in a lower level range or not. This is because it is desirable that the sampled current values assume higher levels over a wide range for accurately determining a voltage-current relation, as will be derived in the following step. If a YES answer is obtained in step 105, then the routine proceeds to step 106 wherein a relational equation between voltage and current is determined based on the data stored in the memory location Me1.

Subsequently, the routine proceeds to step 107 shown in FIG. 4 wherein a voltage value Vn when the battery unit 1 is discharged at 200 A (hereinafter, referred to as a 200 A-discharged voltage value) is projected mathematically using the relational equation derived in step 106. The routine then proceeds to step 108 wherein a 200 A-discharged voltage value Vm corresponding to the amount of discharged electric power Wq derived in step 102 is determined by using the battery characteristic stored in the memory 5b.

The routine then proceeds to step 109 wherein it is determined whether or not Vn is smaller than Vm in order to determine the occurrence of charge polarization in the battery unit 1. If a YES answer is obtained (Vn<Vm), it is concluded that the charge polarization did not occur, and then the routine proceeds to step 110 wherein the discharged electric power Wq and the voltage value Vn are stored in a memory location Me2 of the memory 5b. The routine then proceeds to step 111 wherein it is determined whether the number of data pieces stored in the memory location Me2 is greater than or equal to 10 or not. If a YES answer is obtained, then the routine proceeds to step 112 wherein the available electric power $W_{now}$ is updated based on the battery characteristic shown in FIG. 2 and the latest ten data pieces stored in the memory location Me2 in the following manner.

Figure 5:
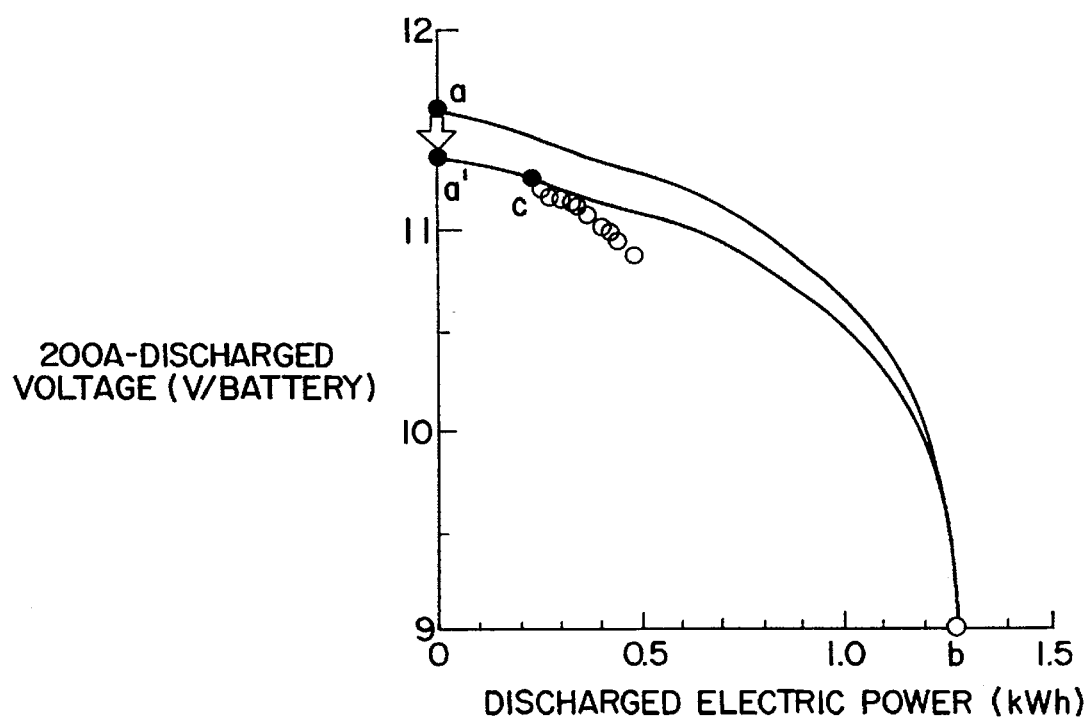
FIGS. 5 and 6 are graphs for explaining a technique of updating a battery characteristic stored in a memory.
Figure 6:
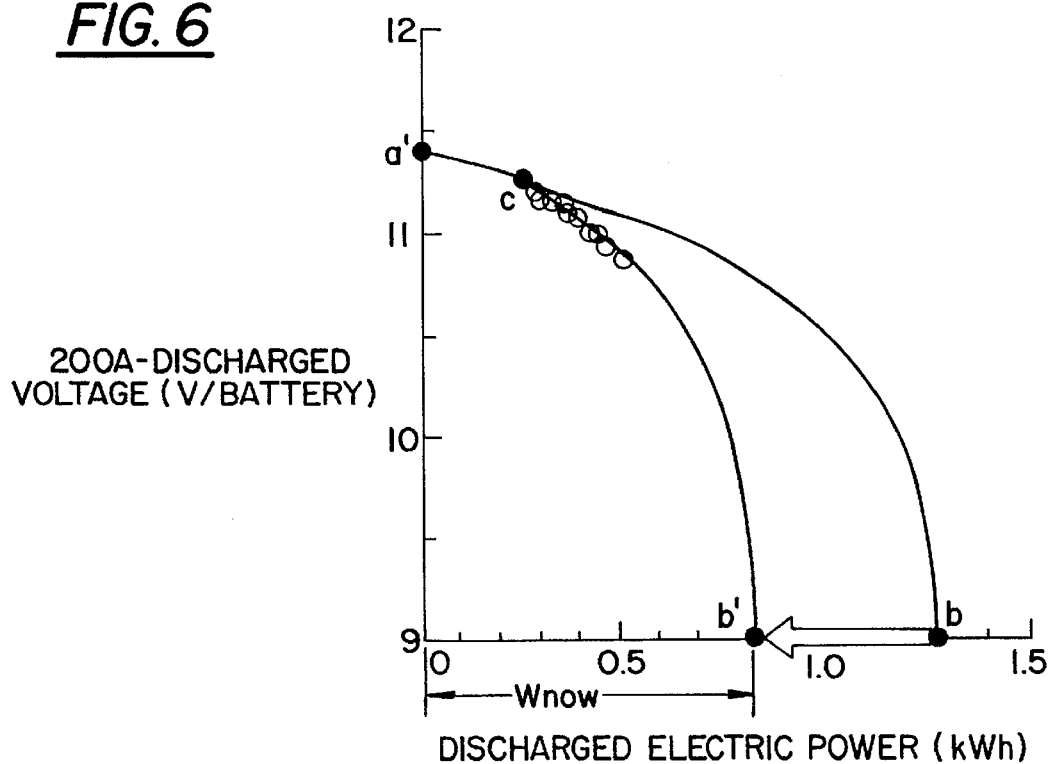

FIG. 5 shows the relation between a 200 A-discharged voltage value and the amount of discharged electric power per battery. The fully discharged voltage level (i.e., a discharge disable voltage level) of the battery unit 1 is 9 V per battery. If the relation between the discharged electric power Wq and the 200 A-discharged voltage value Vn stored in the memory location Me2 of the memory 5b varies, as shown by "o", the battery characteristic stored in the memory 5b is first corrected by shifting the line P to the line Q extending from a fixed point b to a point a' through a point c which indicates a minimum value of the discharged electric power. Next, the line Q is, as shown in FIG. 6, further corrected by shifting the point b to the point b' while the point c is fixed to define the line R for minimizing an error function J, as expressed by the following equation (2).

$$J = \sum_{i=1}^{10} (Vni - Vmi) \qquad (2)$$

The above mentioned battery characteristic may alternatively be determined mathematically in a given optimization manner.

With the above correction of the battery characteristic, the available electric power $W_{now}$ is updated according to an actual traveling condition (i.e., a variation in load of the motor 2) and deterioration of the battery unit 1.

Referring back to FIG. 4, after step 112, the routine proceeds to step 113 wherein it is determined whether the electric automobile is stopped, and a normal battery recharging operation has been initiated or not. If a YES answer is obtained, the program terminates. Alternatively, if a NO answer is obtained, then the routine returns back to step 101.

If a NO answer is obtained in step 109 meaning that the battery unit 1 is still subjected to the influence of charge polarization, then the routine proceeds directly to step 113 without updating the available electric power $W_{now}$. In other words, if it is concluded that the charge polarization being generated in the battery unit 1 prevents the available reserve power remaining in the battery unit 1 (i.e., the residual electric energy $SOC_w$) from being determined correctly, the available reserve power is calculated using the available electric power $W_{now}$ one program cycle earlier.

Figure 7:
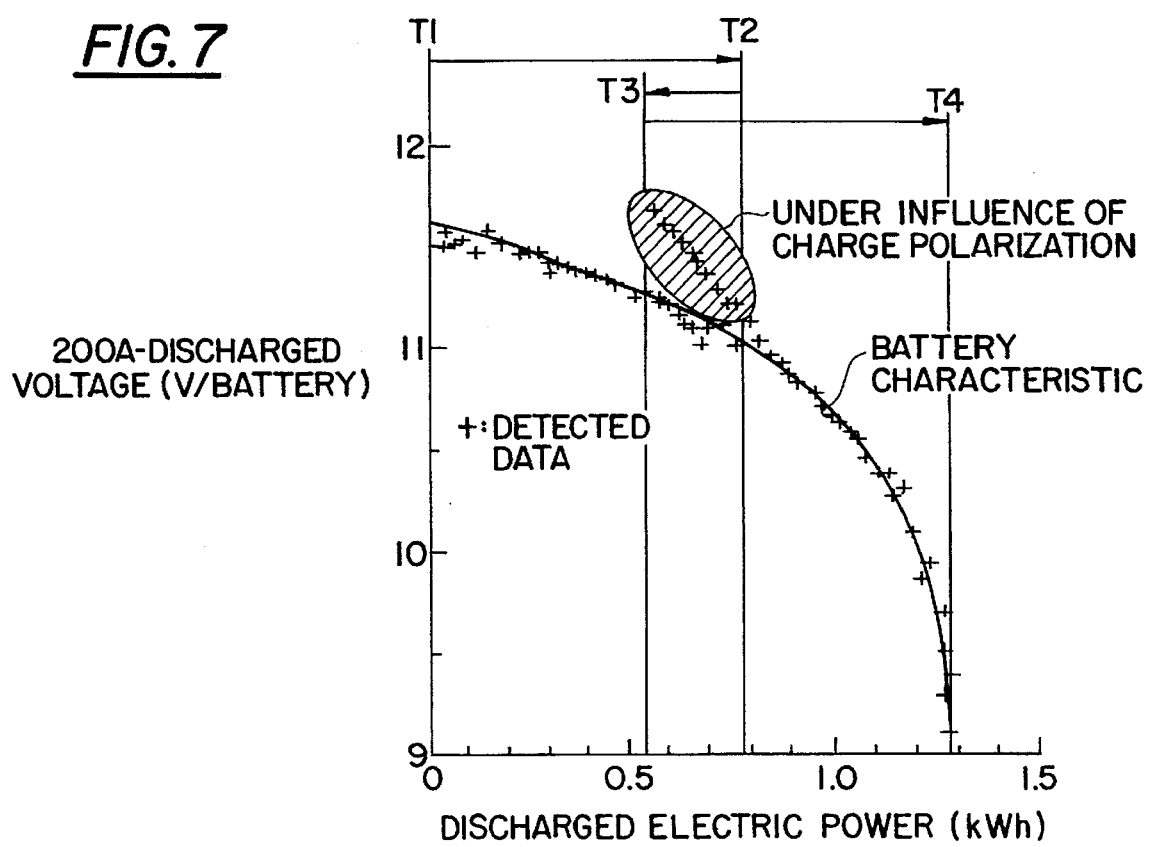
FIG. 7 is a graph which shows the influence of charge polarization occurring in a storage battery.
Figure 8:
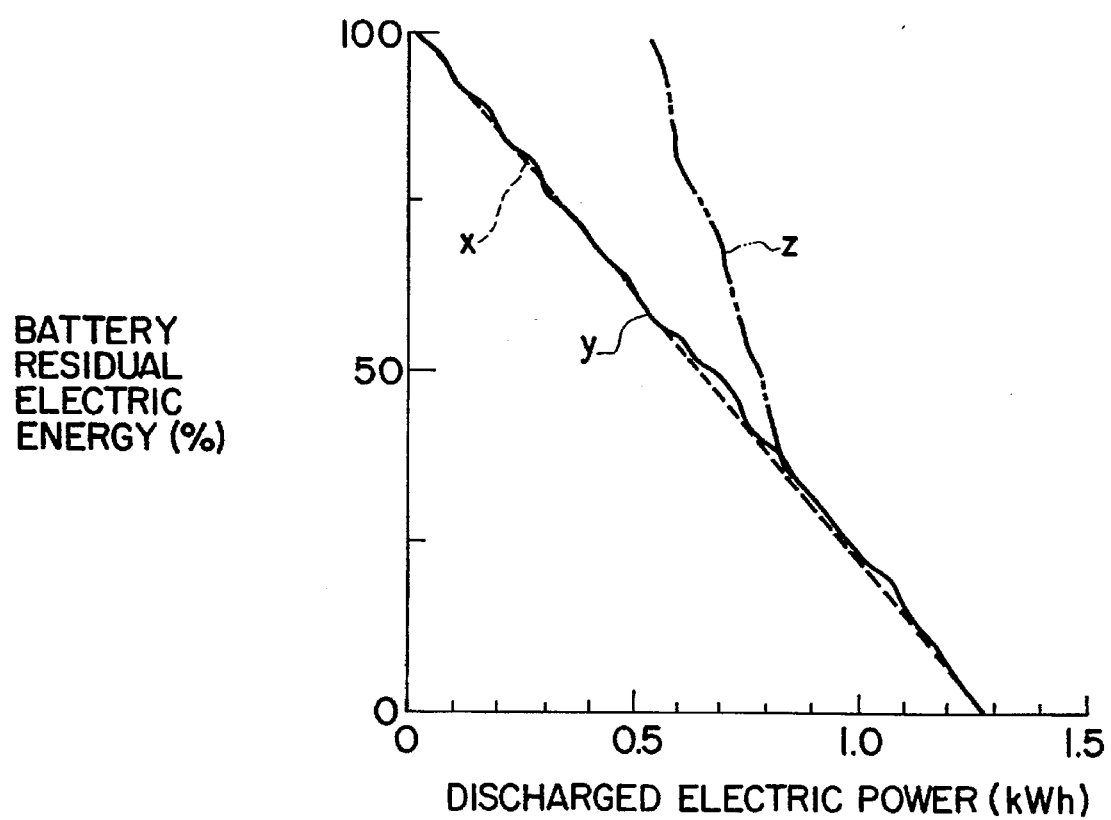
FIG. 8 is a graph which shows an error incurred in determination of an available reserve electric power of a storage battery under the influence of charge polarization.

FIG. 7 is a graph showing experimental results when the battery unit 1 is charged at high speed from a time T2 to a time T3 while the electric automobile is traveling on a road. A symbol "+" represents data stored in the memory location Me2 of the memory 5b indicating the relation between the amount of discharged electric power and a 200 A-discharged voltage value. A solid line represents the battery characteristic stored in the memory 5b. The graph shows that immediately after the high-speed charging, the 200 A-discharged voltage value shows higher levels under the influence of charge polarization. FIG. 8 shows the relation between the residual electric energy SOCw and the discharged electric power. A broken line x represents actual residual electric energy. A solid line y represents residual electric energy calculated after the processing following the determination of the charge polarization in step 109 of FIG. 4 is executed. A two-dot chain line z represents residual electric energy calculated without executing the processing following step 109. The graph shows that when the processing following step 109 is executed, the residual electric energy (i.e., the line y) of the battery unit 1 is determined correctly without being affected by the charge polarization even immediately after high-speed charging. Note that FIG. 8 does not show residual battery electric energy during high-speed charging.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A battery condition determining apparatus comprising:

detecting means for detecting a voltage of a storage battery and a current flowing from said storage battery to a given electric load;

battery characteristic storing means for storing a given battery characteristic of said storage battery, said battery characteristic representing a predetermined relation between a voltage level of said storage battery at which a given level of current flows from said storage battery and an amount of discharged electric power discharged from said storage battery;

first battery condition parameter determining means for determining a first battery condition parameter representing a voltage level of said storage battery relative to a given projected level of current using a relation between said voltage and said current detected by said detecting means;

second battery condition parameter determining means for determining a second battery condition parameter representing a voltage level of said battery characteristic stored in said battery characteristic storing means corresponding to said amount of discharged electric power based on said voltage and said current detected by said detecting means; and charge polarization determining means for determining an occurrence of a charge polarization in said storage battery, said charge polarization determining means determining said occurrence of said charge polarization when said second battery condition parameter is different from said first battery condition parameter.

2. A battery condition determining apparatus as set forth in claim 1, further comprising:

battery power determining means for determining an amount of available reserve electric power remaining in said storage battery based on said amount of discharged electric power discharged from said storage battery and said battery characteristic stored in said battery characteristic storing means;

said detecting means sampling said voltage and said current of said storage battery at a given sampling cycle; and said battery power determining means updating said battery characteristic stored in said battery characteristic storing means based on a latest sampled voltage and current, and being prohibited from updating said battery characteristic when said charge polarization determining means determines said occurrence of said charge polarization.

3. A battery condition determining apparatus as set forth in claim 2, wherein:

said charge polarization determining means determines said occurrence of said charge polarization when said second battery condition parameter is greater than said first battery condition parameter.

4. A battery condition determining apparatus as set forth in claim 2, wherein:

said battery power determining means determines an amount of available reserve electric power $SOC_W$ based on a following relation:

$$SOC_W = (W_{now} - Wq)/Wb \bullet 100(\%)$$

where $W_{now}$ represents an amount of useful electric power of said storage battery over a range from a fully charged voltage level to a fully discharged voltage level, defined by said battery characteristic stored in said battery characteristic storing means, Wq represents said discharged electric power, and Wb is an initial value of $W_{now}$.

5. A battery condition determining apparatus comprising:

detecting means for detecting a voltage of a storage battery and a current flowing from said storage battery to a given electric load;

battery characteristic storing means for storing a battery characteristic defined by a parameter representing a given battery condition including a predetermined relation between a voltage level of said storage battery at which a given level of current flows from said storage battery and an amount of discharged electric power discharged from said storage battery;

battery power determining means for determining an amount of available reserve electric power of said storage battery, based on said amount of discharged electric power discharged from said storage battery, based on said voltage and said current detected by said detecting means, based on an amount of useful electric power of said storage battery over a range from a fully charged voltage level to a fully discharged voltage level, and based on said parameter in said battery characteristic stored in said battery characteristic storing means;

first battery condition parameter determining means for determining a first battery condition parameter representing said voltage level of said storage battery relative to a projected level of current using a relation between said voltage and said current detected by said detecting means;

second battery condition parameter determining means for determining a second battery condition parameter representing a voltage level of said battery characteristic stored in said battery characteristic storing means corresponding to said amount of discharged electric power based on said voltage and said current detected by said detecting means; and charge polarization determining means for determining an occurrence of a charge polarization in said storage battery, said charge polarization determining means determining said occurrence of said charge polarization when said second battery condition parameter is different from said first battery condition parameter.

6. A battery condition determining apparatus as set forth in claim 5, wherein:

said detecting means samples said voltage and said current of said storage battery at a given sampling cycle;

said battery power determining means updates said battery characteristic stored in said battery characteristic storing means based on a latest sampled voltage and current and is prohibited from updating said battery characteristic when said charge polarization determining means determines said occurrence of said charge polarization.

7. A method for determining a condition of a battery comprising steps of:

detecting a voltage of a storage battery and a current flowing from said storage battery to a given electric load;

storing a battery characteristic of said storage battery representing a predetermined relation between a voltage level of said storage battery at which a given level of current flows from said storage battery and an amount of discharged electric power discharged from said storage battery;

determining a first battery condition parameter representing a voltage level of said storage battery relative to a projected given level of current using a relation between said voltage and said current detected by said step of detecting;

determining a second battery condition parameter representing a voltage level in said battery characteristic corresponding to said amount of discharged electric power based on said voltage and said current detected by said step of detecting; and determining an occurrence of a charge polarization in said storage battery when said second battery condition parameter is different from said first battery condition parameter.

8. A method for determining a condition of a battery as set forth in claim 7, further comprising steps of:

determining an amount of available reserve electric power remaining in said storage battery based on said amount of discharged electric power discharged from said storage battery;

said step of detecting further comprising:
sampling said voltage and said current of said storage battery at a given sampling cycle;

said step of determining said amount of available reserve electric power comprising a step of:
updating said battery characteristic based on a latest sampled voltage and a latest sampled current only when said step of determining said occurrence of said charge polarization determines said charge polarization has not occurred.

* * * * *